(12) United States Patent
Totani et al.

(10) Patent No.: US 10,058,010 B2
(45) Date of Patent: Aug. 21, 2018

(54) HEAT-EXCHANGER HEAT SINK AND HEAT EXCHANGER PROVIDED WITH THE HEAT SINK

(71) Applicant: UACJ Corporation, Tokyo (JP)

(72) Inventors: Yuki Totani, Aichi (JP); Tetsuro Hata, Aichi (JP); Yasuhiro Yagita, Aichi (JP); Kazuyoshi Shoutsubo, Aichi (JP)

(73) Assignee: UACJ CORPORATION, Tokyo (JP)

( * ) Notice: Subject to any disclaimer, the term of this patent is extended or adjusted under 35 U.S.C. 154(b) by 0 days.

(21) Appl. No.: 15/395,103

(22) Filed: Dec. 30, 2016

(65) Prior Publication Data

US 2017/0215302 A1 Jul. 27, 2017

(30) Foreign Application Priority Data

Jan. 21, 2016 (JP) ................. 2016-009794

(51) Int. Cl.
*H05K 7/20* (2006.01)
*H01L 23/473* (2006.01)
(Continued)

(52) U.S. Cl.
CPC .......... *H05K 7/20509* (2013.01); *F28F 3/06* (2013.01); *F28F 3/12* (2013.01); *H01L 23/473* (2013.01);
(Continued)

(58) Field of Classification Search
CPC .............. H01L 23/467; H05K 7/20509; H05K 7/20154; F28F 2275/14
(Continued)

(56) References Cited

U.S. PATENT DOCUMENTS 1,766,701 A * 6/1930 Blackmore ......... F24D 19/0082
 165/185
5,542,176 A * 8/1996 Serizawa ............ H01L 23/3672
 165/185
(Continued)

FOREIGN PATENT DOCUMENTS

JP 60068655 U 5/1985
JP S61-23349 A 1/1986
(Continued)

OTHER PUBLICATIONS

Office Action from the Japanese Patent Office dated Sep. 13, 2016 in related Japanese application No. 2016-009794, and translation of substantive portions thereof.
(Continued)

*Primary Examiner* — Leonard R Leo
(74) *Attorney, Agent, or Firm* — J-Tek Law PLLC; Jeffrey D. Tekanic; Scott T. Wakeman

(57) ABSTRACT

A heat-exchanger heat sink (1; 102; 103; 104) includes a plurality of fin plates (2; 202; 203; 203*a*, 203*b*; 205), which are lined up spaced apart from one another in a plate-thickness direction; and at least one linking part (3; 3*a*, 3*b*; 304), which is disposed such that it intersects and hold the plurality of fin plates (2). The at least one linking part has a base (31), which may be rod or bar shaped, and a plurality of positioning protrusions (32), which protrude from a side surface of the base. Each of the fin plates has at least one latching groove (21, 26), into which the base is inserted such that each fin plate is located between adjacent positioning protrusions of the at least one linking part.

20 Claims, 11 Drawing Sheets

(51) Int. Cl.
*F28F 3/06* (2006.01)
*F28F 3/12* (2006.01)
*H01L 23/467* (2006.01)

(52) U.S. Cl.
CPC ......... *F28F 2275/14* (2013.01); *H01L 23/467* (2013.01); *H05K 7/20154* (2013.01)

(58) Field of Classification Search
USPC .................................................. 165/78, 80.3
See application file for complete search history.

(56) References Cited

U.S. PATENT DOCUMENTS

| | | | | |
|---|---|---|---|---|
| 6,636,423 | B2* | 10/2003 | Rinella | H01L 23/3672 165/185 |
| 6,681,847 | B1* | 1/2004 | Lee | H01L 23/3672 165/185 |
| 6,691,769 | B2 | 2/2004 | Johnson et al. | |
| 6,808,012 | B1* | 10/2004 | Chen | H01L 23/4093 165/185 |
| 6,924,983 | B2* | 8/2005 | Otsuki | H01L 23/467 165/185 |
| 2007/0084583 | A1* | 4/2007 | Pan | H01L 23/3672 165/80.3 |
| 2007/0246190 | A1 | 10/2007 | Wei | |
| 2008/0023189 | A1 | 1/2008 | Kimura et al. | |
| 2009/0178795 | A1* | 7/2009 | Wei | H01L 23/3672 165/185 |
| 2012/0262880 | A1 | 10/2012 | Tsuchida et al. | |
| 2014/0367702 | A1 | 12/2014 | Yamamoto et al. | |
| 2015/0189791 | A1 | 7/2015 | Tamura | |

FOREIGN PATENT DOCUMENTS

| | | |
|---|---|---|
| JP | H0247895 A | 2/1990 |
| JP | H10-22668 A | 1/1998 |
| JP | 2011243994 A | 12/2011 |
| JP | 2012156372 A | 8/2012 |
| JP | 2012227297 A | 11/2012 |
| JP | 2013116473 A | 6/2013 |
| JP | 2015126050 A | 7/2015 |
| JP | 2016004805 A | 1/2016 |
| WO | 2013114647 A1 | 8/2013 |

OTHER PUBLICATIONS

Office Action from the Japanese Patent Office dated Mar. 14, 2017 in related Japanese application No. 2016-009794, and translation thereof.
Office Action from the Japanese Patent Office dated Aug. 8, 2017 in related Japanese application No. 2016-009794, and English translation thereof.
Extended European Search Report from the European Patent Office dated May 19, 2017 in related EP application No. 17 151 215.5, including European Search Opinion and European Search Report.
Office Action from the Korean Patent Office dated Jun. 22, 2018 in counterpart Korean application No. 10-2016-0171346, and translation thereof.

* cited by examiner

HEAT-EXCHANGER HEAT SINK AND HEAT EXCHANGER PROVIDED WITH THE HEAT SINK

CROSS-REFERENCE

This application claims priority to Japanese patent application no. 2016-9794 filed on Jan. 21, 2016, the contents of which are fully incorporated herein by reference.

TECHNICAL FIELD

The present invention relates to a heat-exchanger heat sink and to a heat exchanger provided with the heat sink.

BACKGROUND ART

Inverter units are used in various applications such as in the control of a drive motor of, for example, a hybrid automobile, an electric vehicle, or the like. An inverter unit comprises a semiconductor (switch) device, such as an IGBT (insulated gate bipolar transistor), and a heat exchanger for cooling the semiconductor device as well as other heat generating elements (bodies) such as the electronic parts that constitute the power conversion circuit. The heat exchanger comprises a jacket, on the outer surface of which the heat generating elements are mounted, and a heat sink, which is housed inside the jacket. To improve the performance of the heat exchanger, production efficiency, and the like, the heat sink is usually joined to the jacket by brazing.

Such heat sinks are often configured as a plate-fin heat sink, in which multiple fin plates extend vertically (perpendicularly) from a base plate. In the past, this type of heat sink has been manufactured by extrusion. However, because there are restrictions on the shapes that can be manufactured with extrusion techniques, it is difficult to manufacture, for example, a heat sink in which the plate thickness of the fin plates is relatively thin, a heat sink in which the tongue ratio (i.e. the ratio of the height to the pitch of each fin plate) is large, or the like. Thus, in previously-known techniques, the restrictions on, for example, the shape, the pitch, the tilt, and the like of the fin plates disadvantageously decrease the number of degrees of freedom in the design of the heat sink.

Accordingly, to increase the number of degrees of freedom in the design of the heat sink, Japanese Laid-open Patent Publication 2013-116473 discloses a technique in which the fin plates and the base plate are separately prepared and are then integrated (joined) by brazing. In addition, Japanese Laid-open Patent Publication 2015-126050 and its counterpart US 2015/0189791 disclose a technique in which multiple fin plates are disposed such that they are spaced apart and parallel to one another and then are linked by rod-shaped linking members.

SUMMARY OF THE INVENTION

However, in the heat sink of JP 2013-116473, brazed parts between the fin plates and the base plate are remelted when brazing to the jacket. Therefore there is a risk that tilting, mispositioning, or the like of the fin plates will occur while brazing the jacket, which is undesirable because it could lead to a decrease in the cooling performance of the heat exchanger.

In the heat sink of JP 2015-126050 and US 2015/0189791, after punching out a plurality of elongated rectangular fin plates from a metal blank plate, it is necessary to bend bridge portions, which are located between and connect adjacent fin plates, into substantially an S shape. Then, to further link (connect) and fixedly support the plurality of fin plates, rod-shaped connection members must be press-fit into cutouts (notches) in the fin plates. These manufacturing and assembly steps could cause the fin plates to tilt, deform, or the like, which will decrease the cooling performance of the heat exchanger.

It is therefore an object of the present teachings is to disclose a heat-exchanger heat sink, in which the number of degrees of freedom in the design is high, productivity and cooling performance are excellent, and dimensional accuracy after being attached to a heat exchanger is high, as well as to disclose a heat exchanger comprising the heat-exchanger heat sink.

In one embodiment of the present teachings, a heat-exchanger heat sink comprises:
- a plurality of fin plates, which are lined up spaced apart from one another in a plate-thickness direction; and
- at least one linking part, which is disposed such that it intersects the plurality of fin plates and holds the plurality of fin plates;
- wherein the at least one linking part comprises a base, which has, e.g., a rod or bar shape, and a plurality of positioning protrusions, which protrude from a side (edge) surface of the base part; and
- each of the fin plates has at least one latching groove, into which a portion of the base located between adjacent positioning protrusions of the linking part is inserted.

In another embodiment of the present teachings, a heat exchanger comprises:
- the heat-exchanger heat sink according to the above-described embodiment; and
- a jacket that houses the heat-exchanger heat sink;
- wherein a heat-generating-element mounting surface, on which a heat-generating element (body) is to be mounted, is provided (defined) on an outer surface of the jacket;
- the jacket has a coolant-inflow port, into which a coolant flows, a coolant-outflow port, from which the coolant is discharged, and a coolant passageway, which fluidly connects the coolant-inflow port and the coolant-outflow port; and the heat-exchanger heat sink is disposed in the coolant passageway.

Heat-exchanger heat sinks (hereinbelow, abbreviated as "heat sink") according to the present teachings comprise the plurality of fin plates and at least one linking part. In addition, portions of the base of the linking part that are located between adjacent positioning protrusions are inserted into the latching grooves of the fin plates.

As compared with known heat sinks that are integrally formed by extrusion, the present heat sinks have fewer restrictions on the shape, the tilt, and the like of the fin plates, the spacing between adjacent fin plates, and the like. Therefore, the number of degrees of freedom in the design of the present heat sinks can be increased over what it was in the past.

In addition, the heat sinks of the present teachings can be assembled by a simple operation in which the base of the linking part is inserted into the respective latching grooves of the fin plates. Therefore, the heat sink assembly method has high productivity.

In addition, in the heat sinks of the present teachings, the plurality of fin plates can be held by inserting the base of the at least one linking part into the respective latching grooves of the fin plates. Therefore, the linking part need not be press-fit into cutouts (notches) in the plurality of fin plates in order to fix the fin plates. Accordingly, the design of the present heat sinks reduces or eliminates the occurrence of tilting, deformation or the like of the fin plates during assembly. Furthermore, because the at least one linking part holds the plurality of the fin plates, problems, such as tilting of the fin plates, the occurrence of mispositioning (misalignment) or the like, can be avoided when the heat sink is joined to the jacket of the heat exchanger by brazing.

Therefore, heat sinks according to the present teachings exhibit improved dimensional accuracy after the heat sink is attached to the heat exchanger as compared to known heat sink designs.

As was described above, if the heat sink is designed according to the above-described configuration, it will have a large number of degrees of freedom in the design and excellent productivity and cooling performance. Furthermore, it can be designed such that the dimensional accuracy after the heat sink is attached to the heat exchanger is increased.

In addition, because the heat exchangers can be designed with a heat sink according to the present teachings inside the jacket, such a heat exchanger will excel in cooling performance.

DETAILED DESCRIPTION

Figure 1:
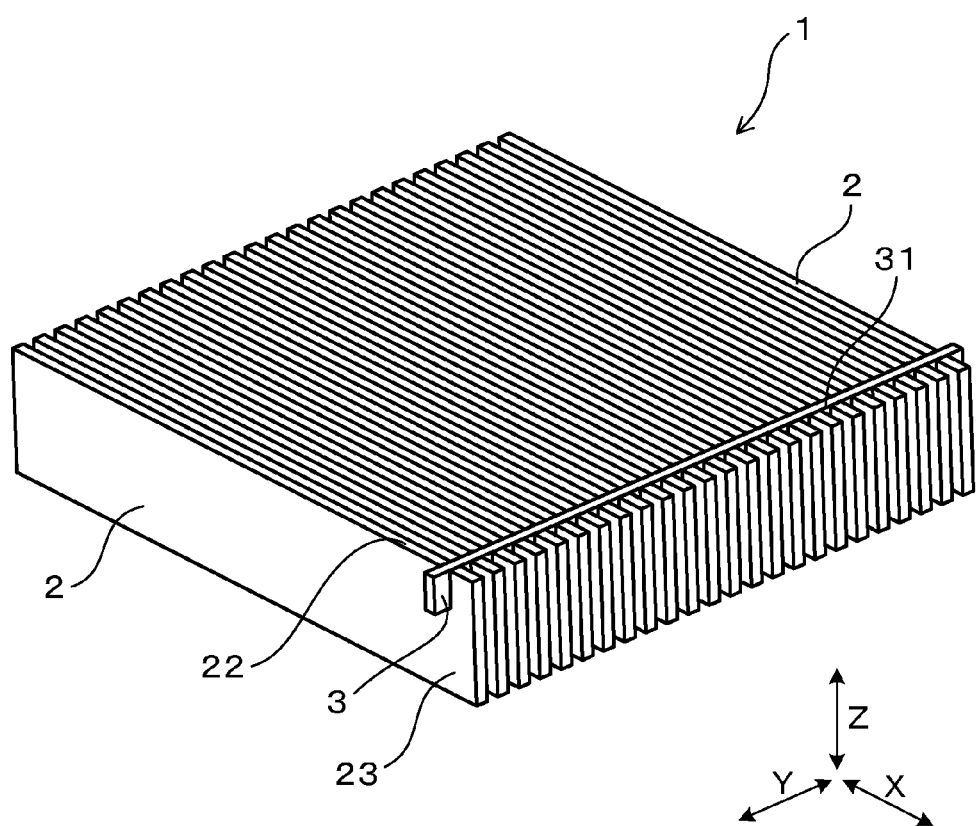
FIG. 1 is an oblique view of a heat sink according to an embodiment (working example 1) of the present teachings.

In the above-described heat sink, the shape, the spacing, and the like of the fin plates can be set appropriately in accordance with the design of the heat exchanger. For example, the heat sink optionally may have a narrow-pitch section, in which the spacing between adjacent fin plates is $d_1$, and a wide-pitch section, in which the spacing between adjacent fin plates is $d_2$, which is wider than $d_1$. In such a design, because the passageway resistance (flow resistance) of a coolant in the narrow-pitch section is higher than in the wide-pitch section, a greater amount of the coolant can be forced (caused) to circulate through the wide-pitch section. Therefore, the cooling performance of the heat exchanger can be improved by adjusting the balance in the flow rates of the coolant flowing between the fin plates.

In addition, the above-described heat sink may include a portion in which the spacing between adjacent fin plates is narrower than the plate thickness of the fin plates. It has been difficult in the past to manufacture a heat sink having such a configuration. However, the spacing between adjacent fin plates in heat sinks according to the present teachings can be freely adjusted by appropriately modifying the outer dimension, in a direction parallel to the plate-thickness direction of the fin plates, of the positioning protrusions of the at least one linking part. Therefore, the spacing between adjacent fin plates can be made narrower than the plate thickness of the fin plates by making the outer dimension of the positioning protrusions smaller than the plate thickness of the fin plates.

In addition, the degree of planarity (flatness) of end surfaces of the heat sink in the plate-width direction of the fin plates is preferably 0.2 mm or less. That is, the degree of planarity (flatness) is determined by defining two planes that are parallel to each other in the plate-width direction of the fin plates and determining the minimum distance (range) between the two planes, in which all of one of the end surfaces of the fin plates in the plate-width direction lie. According to the present teachings, it is preferable that this minimum distance between the two planes is 0.2 mm or less. Likewise, the degree of planarity (flatness) of the other (opposite) end surface of the fin plates in the plate-width direction is also preferably 0.2 mm or less.

If this flatness tolerance is satisfied, both of the end surfaces (in the plate-width direction) of each fin plate can be easily brazed to the adjacent inner-wall surfaces of a jacket, whereby the heat from a heat generating element mounted on a heat-generating-element mounting surface can be transmitted to every fin plate with good efficiency. As a result, the cooling performance of the heat exchanger can be further improved. To further improve the cooling performance of the heat exchanger, the degree of planarity (flatness) of the end surfaces of the heat sink is preferably less than 0.1 mm and more preferably 0.05 mm or less, on one or both of the top and bottom (end) surfaces of the heat sink.

It is noted that a method for quantitatively measuring the degree of planarity (flatness) is explained in the working examples below.

Any well-known shape, such as, for example, a flat-plate shape or a curved-plate shape, can be used as the shape of the individual fin plates. In addition, unevenness, cut-and-raised parts, and the like for disturbing the flow of the coolant may be formed on the surfaces of the fin plates.

The fin plates may all have the same configuration, or some of the fin plates may have a configuration that differs. For example, the plate thickness of some of the fin plates may be thicker than that of other fin plates. In addition, unevenness and the like described above may be formed on the surfaces of some of the fin plates and not formed on the surfaces of other fin plates.

The plate thickness of the fin plates is preferably 0.3 mm or more. Because the stiffness of the fin plates is higher in this case, deformation, tilt, and the like of the fin plates during assembly or the like of the heat sink can be reliably avoided. On the other hand, to improve productivity, the plate thickness of the fin plates is preferably 1.5 mm or less. If the plate thickness of the fin plates is greater than 1.5 mm, then manufacture by press working will become difficult, and consequently there will be a risk that the productivity of the manufacturing process for the fin plates will decrease.

The plate width of the fin plates is not particularly limited and can be set appropriately in accordance with the design or particular application of the heat exchanger. If the heat sink is housed inside the jacket of the heat exchanger, then it is preferable that the fin plates are configured such that both end surfaces in the plate-width direction respectively make contact with the opposite inner-wall surfaces of the jacket. In this case, heat from the heat generating element mounted on the heat-generating-element mounting surface can be transmitted to every fin plate with good efficiency. As a result, the cooling performance of the heat exchanger can be further improved.

As was noted above, the degree of planarity (flatness) of the individual end surfaces in the plate-width direction is preferably 0.2 mm or less. In this case, both end surfaces (in the plate-width direction) of each fin plate can be easily brazed to the respective inner-wall surfaces of the jacket, and consequently heat from the heat generating element mounted on the heat-generating-element mounting surface can be transmitted to every fin plate with good efficiency. As a result, the cooling performance of the heat exchanger can be further improved.

Each fin plate has at least one latching groove at a portion (location) at which the fin plate intersects with the linking part. The position of the latching groove in the longitudinal direction of the fin plate is not particularly limited, as long as it is possible for the linking part to be attached. For example, the latching groove may be formed at (in) a center part of each fin plate in the longitudinal direction or may be formed at (in) an end part in the longitudinal direction. In addition, the position of the latching groove in the longitudinal direction may be the same as the latching groove of an adjacent fin plate, or may differ. To improve productivity, the position of the latching groove in the longitudinal direction is preferably basically the same as that of the latching grooves of adjacent fin plates.

In some embodiments of the present teachings, latching grooves are preferably formed at two or more locations of each fin plate. In such embodiments, the position of the fin plates can be maintained by a plurality of the linking parts, which makes it possible to easily and reliably stabilize the positions of the fin plates. As a result, the dimensional accuracy of the heat sink, after the heat sink has been assembled and attached to the heat exchanger, can be further increased.

The above-mentioned latching grooves are more preferably formed at both end parts of the above-mentioned fin plate in the longitudinal direction, that is, on both sides in the plate-width direction, and the above-mentioned linking parts more preferably hold the above-mentioned plurality of fin plates from (on) both sides in the plate-width direction at both end parts of the above-mentioned fin plates in the longitudinal direction. In such embodiments of the present teachings, the positions of the fin plates can be reliably stabilized by four of the linking parts. As a result, the dimensional accuracy of the heat sink, after it has been assembled and attached to the heat exchanger, can be even further increased.

In some embodiments of the present teachings, the fin plates may have notched parts (or simply "notches"), each of which is recessed from a groove side surface, which form (define) a space between an opening end and a bottom surface of the latching groove, more than the surrounding groove side surface. In addition, claw parts (or simply "claws") of the fin plates may be designed to press against (crimp) the linking part more on the open-end side than on the bottom wall side of the notched part. In such embodiments, the claw parts can better fix the fin plate, and consequently the dimensional accuracy of the heat sink, after the heat sink has been assembled, can be further increased. Furthermore, after the heat sink has been assembled, the one or more linking parts, the fin plates, and the like can be better prevented from separating from the heat sink, which makes it possible to more easily handle the heat sink during subsequent manufacturing processes.

The above-mentioned claw parts can be formed by, for example, inserting the base of the linking part into the latching groove of each fin plate and then crimping the vicinity of the opening ends of the (each) latching groove by pressing the (each) fin plate inward in the plate-width direction. The press-in depth to perform the crimping can be set to, for example, 0.1-0.5 mm and preferably is set to 0.2-0.3 mm.

If the press-in depth is less than 0.1 mm, then there is a risk that the claw parts will not sufficiently press against the linking part and that the clamping or squeezing effect of the claw parts will not be obtained. On the other hand, if the press-in depth is greater than 0.5 mm, the volume of the recess of the pressed-in portion (depression) caused by the crimping work may become excessively large. As a result, there is a risk that, for example, when brazing to the jacket, sufficient filler material will not be supplied into the pressed-in portion (depression).

In addition, when performing the crimping, the distance from the opening ends of the latching groove to the centers of pushed-in parts (depressions) formed by the crimping is preferably within a range of 0.2-1.0 mm. If this distance is shorter than 0.2-1.0 mm, that is, if the position at which the fin plate is pressed-in is too close to the latching groove, the clamping or squeezing effect of the claw parts will not be obtained because it will be difficult to increase the size of the claw parts. On the other hand, if this distance is longer than 0.2-1.0 mm, that is, if the position at which the fin plate is pressed-in is too far from the latching groove, the clamping or squeezing effect of the claw parts will not be obtained because the claw parts will not be sufficiently pressed against the linking part.

The (each) linking part, which holds the plurality of fin plates, has a base, which may be rod or bar shaped, and a plurality of positioning protrusions, which protrude from a side (edge) surface of the base. The (each) linking part can be formed by, for example, punching out or "blanking" a metal plate.

The height of the (each) linking part, that is, the outer dimension of the linking part, which is a combination of the bases and the positioning protrusions, in a direction at a right angle to the longitudinal direction of the base part is preferably 1.5 mm or more. By setting the height of the linking part to 1.5 mm or more, the portion of base located between adjacent positioning protrusions can be easily inserted into the latching grooves of the fin plates. In addition, in such embodiments, the positions of the fin plates can be easily and reliably stabilized by the linking part(s).

To further stabilize the positions (orientations) of the fin plates, the height of the (each) linking part is preferably relatively high. However, if the height of the (each) linking part is set excessively high, then there is a risk that the passageway resistance of the coolant flowing between adjacent fin plates will become excessively high. In addition, in this case, there is a risk that the passageway resistance will become large when the base is inserted into the latching grooves of the fin plates. To avoid these problems, the height of the linking part is preferably less than half the plate width of the fin plate.

The (each) linking part is preferably attached such that its base is flush with the end surfaces of the fin plates in the plate-width direction or is sunken lower than the end surfaces of the fin plates. In such embodiments, the end surface of the fin plates can be brought into contact with an inner-wall surface of the jacket, and consequently heat from the heat generating element mounted on the heat-generating-element mounting surface can be transmitted to every fin plate with good efficiency. As a result, the cooling performance of the heat exchanger can be further improved.

In some embodiments of the present teachings, the (each) linking part may be attached such that the base becomes flush with the end surfaces of the fin plates in the plate-width direction. In such embodiment, the base of the linking part, together with the end surfaces of the fin plates, can be easily brazed to an inner-wall surface of the jacket, and consequently heat from the heat-generating element can be transmitted to every fin plate with even better efficiency. As a result, the cooling performance of the heat exchanger can be further improved.

The positioning protrusions protrude from a side or edge surface of the base part. The height of the positioning protrusions, that is, the distance from a base to a tip of each positioning protrusion in the direction at a right angle to the longitudinal direction of the base, is preferably 1 mm or more. By setting the height of the positioning protrusions to 1 mm or more, the portions of base located between adjacent positioning protrusions can be easily inserted into the respective latching grooves of the fin plates. In addition, the positions of the fin plates can be further stabilized by the one or more linking parts.

Heat exchangers according to the present teachings can be configured by disposing any of the heat sinks disclosed herein in the coolant passageway of the jacket. The heat sink can be joined to one or two (opposite) inner-wall surface(s) of the jacket by, for example, brazing.

If the heat sink is joined to the jacket by brazing, then both end surfaces of the fin plates in the plate-width direction are preferably brazed to the respective opposite inner surfaces of the jacket. In such embodiments, because heat from the heat-generating element mounted on the heat-generating-element mounting surface can be transmitted to every fin plate with good efficiency, the cooling performance of the heat exchanger can be further improved.

To further improve cooling performance, the heat sink and the jacket are preferably formed from a metal having high thermal conductivity. In addition, besides cooling performance, compactness and lightweightness are required of a heat exchanger that is embedded in an on-vehicle inverter unit, or the like. Consequently, in an on-vehicle heat exchanger, the heat sink and the jacket are preferably formed from aluminum or an aluminum alloy, although the type of metal or alloy used to form the heat sink is not particularly limited in the present teachings.

REPRESENTATIVE EMBODIMENTS
(WORKING EXAMPLES)

Working Example 1

Figure 2:
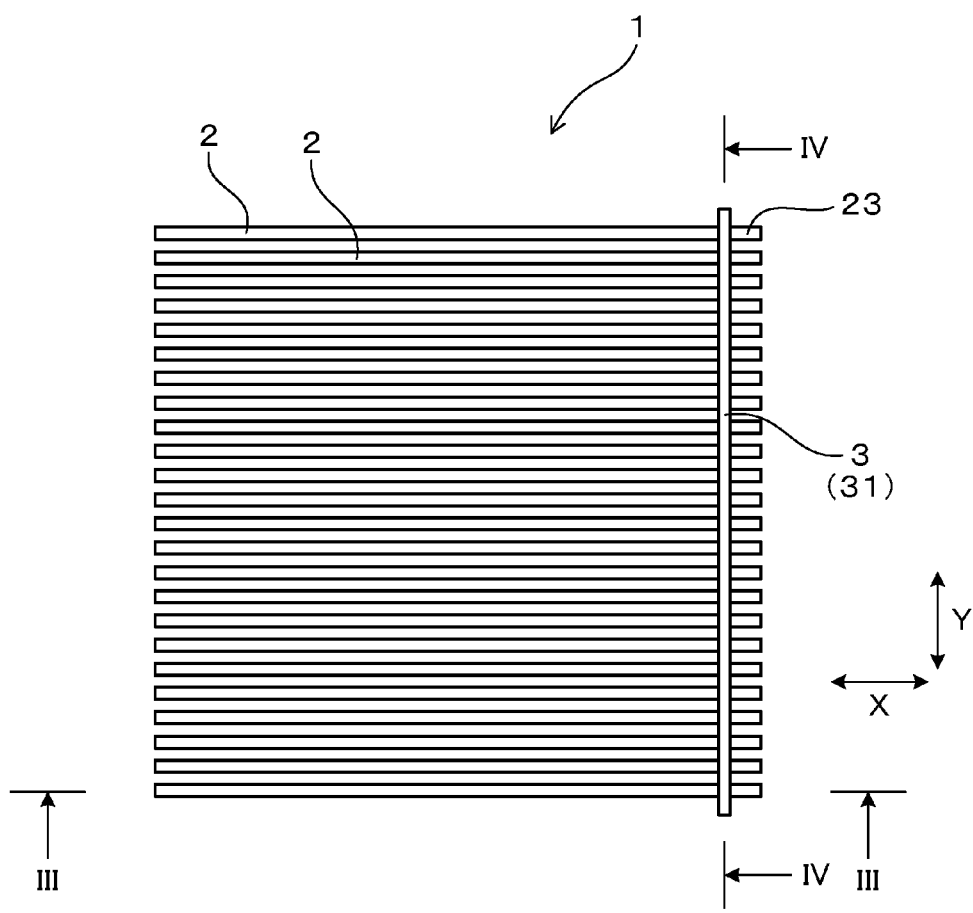
FIG. 2 is a plan view of the heat sink according to working example 1.
Figure 3:
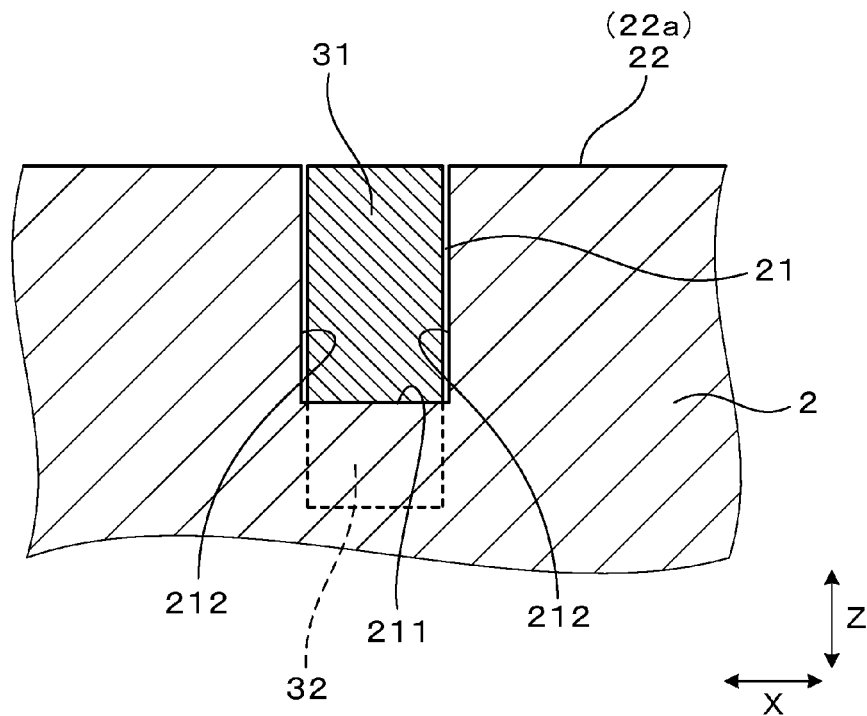
FIG. 3 is a partial enlarged cross-sectional view, taken along line in FIG. 2, in which the vicinity of a latching groove is enlarged.
Figure 5:
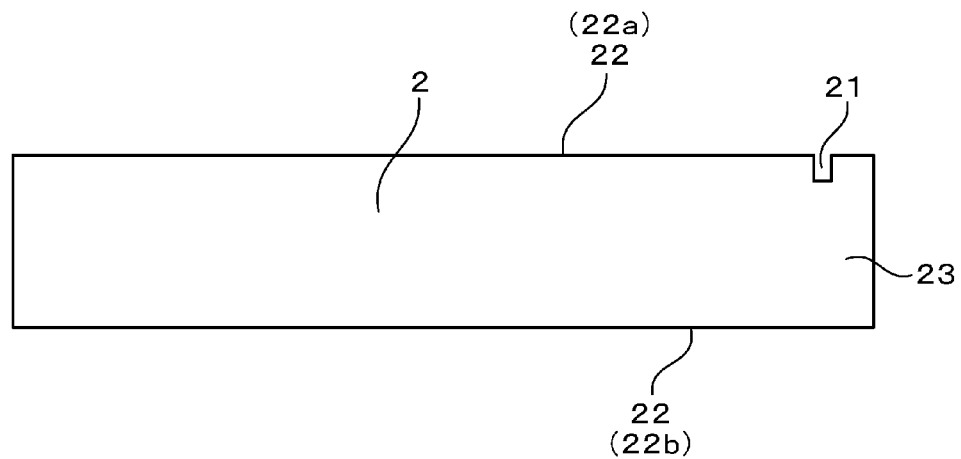
FIG. 5 is a side view of a fin plate according to working example 1.
Figure 6:
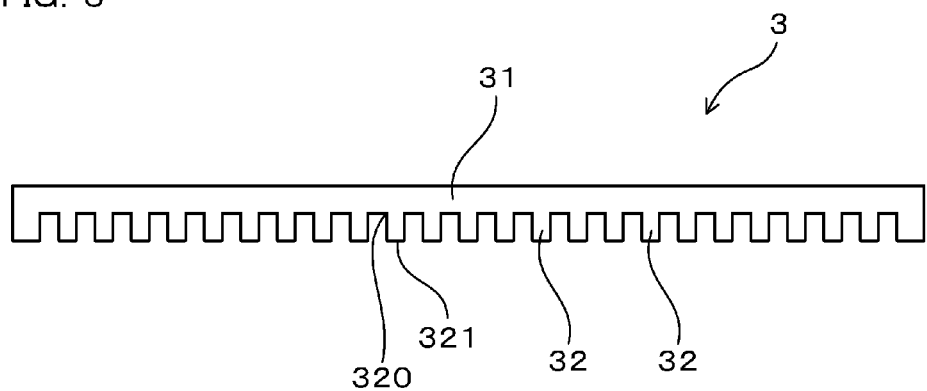
FIG. 6 is a front view of a linking part according to working example 1.

Various working examples of the above-described heat sink will now be explained, with reference to the drawings. First, as shown in FIG. 1 and FIG. 2, a heat sink 1 according to working example 1 of the present teachings comprises a plurality of fin plates 2, which are lined up spaced apart from one another (aligned in parallel) in the plate-thickness direction, and a linking part 3, which is disposed such that it intersects the plurality of fin plates 2 and holds the plurality of fin plates 2. As shown in FIG. 6, the linking part 3 comprises a base 31, which has a rod or bar shape (e.g., a flat, elongated, substantially rectangular shape), and a plurality of positioning protrusions 32, which protrude (project) from a side (edge) surface of the base 31. The linking part 3 has a comb-like shape in which the plurality of positioning protrusions 32 are lined up (extend in parallel) in the longitudinal direction of the base 31. Furthermore, as shown in FIG. 3 and FIG. 5, each fin plate 2 has a latching groove 21 into which the portion of the base 31 of the linking part 3 that is located between adjacent positioning protrusions 32 is inserted.

In the following, "longitudinal direction X" indicates a direction parallel to the longitudinal direction of the fin plates 2 of the heat sink 1, "transverse direction Y" indicates a direction parallel to the lined-up direction of the fin plates 2, and "height direction Z" indicates a direction parallel to the plate-width direction of the fin plates 2. These descriptions relating to the directions of the heat sink 1 are provided for the sake of convenience in the following description of the embodiments of the present teachings.

As shown in FIG. 1 and FIG. 2, the heat sink 1 of working example 1 has a rectangular-parallelepiped shape, wherein the outer dimension in the longitudinal direction X and the outer dimension in the transverse direction Y are substantially the same. The heat sink 1 holds the plurality of fin plates 2 using one linking part 3. In the heat sink 1 of the present working example 1, the spacing between adjacent fin plates 2 is 1.0 mm. The linking part 3 is disposed at one end part of the heat sink 1 in the longitudinal direction X and extends in the transverse direction Y. In addition, the linking part 3 is attached to the plurality of fin plates 2 from (on) one side in the height direction Z.

The degree of planarity (flatness) of each end surface (i.e. the upper and lower surfaces in FIG. 1) of the heat sink 1 in the plate-width direction of the fin plates 2 (i.e. the Z-direction in FIG. 1) can be measured in a quantifiable manner according to the following method. First, the heat sink 1 is mounted on a base plate (flat surface) such that one end surface 22a (refer to FIG. 5) of the pair of end surfaces 22 (22a, 22b) in the plate-width direction of each fin plate 2 is brought into contact with the flat base plate. Next, a height gauge is used to measure, at various positions (locations), the height of the other end surface 22*b* of each fin plate 2 from the base plate. Then, the difference between the maximum height and the minimum height of the measurement results is taken as the degree of planarity (flatness) of the one end surface of the heat sink 1 in the plate-width direction of the fin plates 2. In addition, the degree of planarity (flatness) of the other end surface of the heat sink 1 can be measured by flipping the heat sink 1 over and performing the same measurement as described above.

Figure 4:
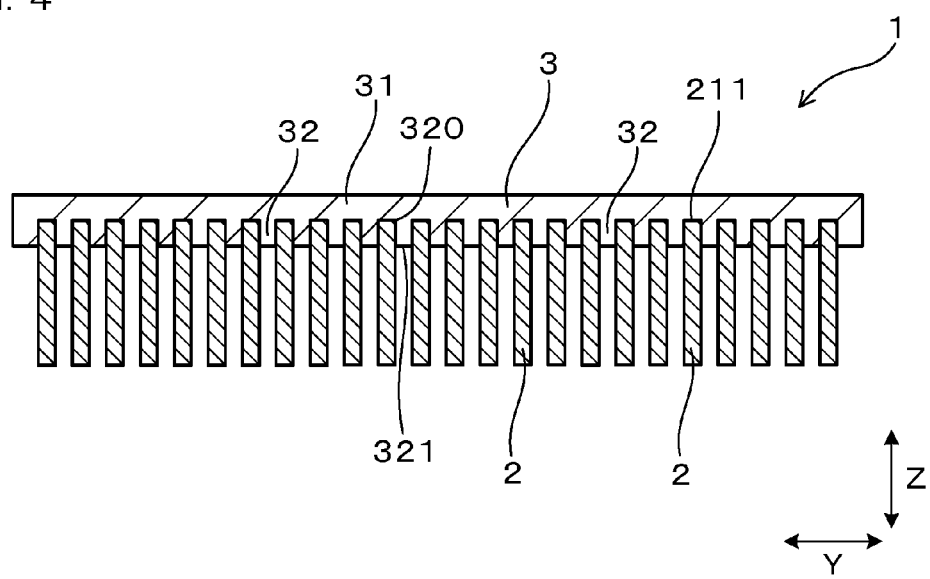
FIG. 4 is a cross-sectional view taken along line IV-IV in FIG. 2.

The heat sink 1 can be assembled by lining up a plurality of the fin plates 2 shown in FIG. 5 such that the fin plates 2 are spaced apart from one another in the plate-thickness direction (i.e. aligning the fin plates 2 in parallel in the Y-direction in FIG. 1) and then, as shown in FIG. 3 and FIG. 4, inserting the base 31 of the linking part 3 into the respective latching grooves 21 of the fin plates 2 such that the positioning protrusions 32 are respectively disposed between adjacent fin plates 2.

Each part of the heat sink 1 will now be explained in greater detail. As shown in FIG. 5, the fin plate 2 has a substantially oblong (e.g., rectangular) shape in a side view. The fin plate 2 can be prepared by, for example, punching out or "blanking" an aluminum plate or an aluminum-alloy plate. Preferably, the fin plate 2 of the present working example 1 is prepared by punching out or "blanking" an aluminum-alloy plate having a plate thickness of 1.0 mm. The plate width of the fin plate 2 is preferably 10.0 mm.

The fin plate 2 of the present working example 1 has one latching groove 21 located on one side in the plate-thickness direction at (within) one end part 23 in the longitudinal direction of the fin plate 2. As shown in FIG. 3, the latching groove 21 has a bottom surface 211, which is substantially parallel to the end surface 22 of the fin plate 2 in the plate-width direction, and a pair of groove side surfaces 212, which are perpendicular to the bottom surface 211. The depth of the latching groove 21 is substantially the same as the height of the base 31 that will be inserted into the latching groove 21. Thereby, the linking part 3 is attached to the fin plates 2 such that the exterior edge of base 31 is substantially flush with the end surface 22 of the fin plate 2 in the plate-width direction. In addition, for example, as shown in FIG. 3, when the base 31 has been inserted into the latching groove 21, there is a slight clearance of, e.g., about 0.02 mm, between the base 31 and the fin plate 2 in the X-direction.

As shown in FIG. 6, the linking part 3 includes the base 31, which is oblong (e.g., rectangular) shaped in a front view, and the plurality of positioning protrusions 32, which protrude from the side (edge) surface of the base part 31. Each protrusion 32 has a square columnar shape. The linking part 3 also can be prepared by, for example, punching out or "blanking" aluminum plate or an aluminum-alloy plate. Preferably, the linking part 3 of the present working example 1 is also prepared by punching out or "blanking" an aluminum-alloy plate having a plate thickness of 1.0 mm.

As shown in FIG. 4, the height of the linking part 3, that is, the outer dimension of the linking part 3, which combines the base 31 and the positioning protrusions 32, in a direction (the height direction Z) at a right angle to the longitudinal direction of the base 31, is less than one-half of the plate width of each fin plate 2. For example, the height of the linking part 3 of the present working example 1 is preferably 3.0 mm. In addition, the positioning protrusions 32 have a height, i.e. the distance from a base 320 to a tip surface 321 of each positioning protrusion 32 in the direction (the height direction Z) at a right angle to the longitudinal direction of the base part 31, of preferably 1.5 mm.

As shown in FIG. 4, when the base 31 has been inserted into the latching grooves 21, the positioning protrusions 32 are disposed between adjacent fin plates 2. At this time, although not shown in the drawings, slight clearances of, e.g., about 0.02 mm, are present between the positioning protrusions 32 and the fin plates 2 in the X-direction.

Next, functions and effects of the heat sink 1 of the present working example 1 will be explained. As was explained in detail above, the present heat sink 1 comprises the plurality of fin plates 2 and the linking part 3. In addition, the base 31 of the linking part 3 is inserted into the latching grooves 21 of the fin plates 2 so that the positioning protrusions 32 act to space apart the fin plates 2 in a fixed arrangement.

In the heat sink 1, the fin plates 2 and the linking part 3 can be manufactured separately; consequently, compared with preexisting heat sinks that are integrally formed by extrusion, there are fewer restrictions on the shape, the tilt, and the like of the fin plates 2, the spacing between adjacent fin plates 2, and the like. Therefore, in the heat sink 1, the number of degrees of freedom in the design can be increased over what it was in the past.

In addition, the heat sink 1 can be assembled using a simple operation in which the base 31 of the linking part 3 is inserted into the latching grooves 21 of the fin plates 2. Therefore, the heat sink 1 can be assembled and manufactured with increased productivity as compared to known methods for manufacturing fin-plate heat sinks.

In addition, in the heat sink 1, the plurality of fin plates 2 can be held merely by inserting the base 31 of the linking part 3 into the latching grooves 21 of the fin plates 2. Thus, the positioning protrusions 32 of the linking part 3 reduce or eliminate the possibility of mispositioning (misalignment) of the fin plates 2 in the transverse direction Y. In addition, the base 31 of the linking part 3 reduces or eliminates the possibility of mispositioning (misalignment) of the fin plates 2 in the longitudinal direction X.

Consequently, in the heat sink 1 according to the present working example 1, there is no need to press-fit the linking part 3 into the plurality of fin plates 2 in order to fix the fin plates 2, as was required in JP 2015-126050 and US 2015/0189791. Accordingly, the design of the present heat sink 1 reduces or eliminates the possibility of tilting, deformation, or the like of the fin plates 2 during assembly. Furthermore, because the plurality of the fin plates 2 is held by the linking part 3 in the embodiment described above, problems, such as tilting of the fin plate(s) 2, the occurrence of mispositioning (misalignment) or the like when the heat sink 1 is joined to the jacket of the heat exchanger by brazing, can be avoided.

Thus, in the heat sink 1, mispositioning or the like of the fin plates 2 at the time of assembly or when brazing to the jacket can be avoided. Therefore, the dimensional accuracy of the heat sink 1 after the heat sink 1 has been attached to the heat exchanger can be increased as compared to known heat exchangers.

As described above, the heat sink 1 according to the present working example 1 provides a large number of degrees of freedom in the design and excellent productivity and cooling performance. Furthermore, a high or precise dimensional accuracy after the heat sink 1 is attached to the heat exchanger can be achieved.

In addition, the linking part 3 is attached such that the base 31 becomes flush with one of the end surfaces 22 of the fin plates 2 in the plate-width direction. Therefore, when the heat sink 1 is joined to the inner surface of the heat exchanger by brazing, both the base 31 of the linking part 3 and the end surface 22 of each fin plate 2 can be uniformly joined to the inner surface of the jacket. As a result, heat from the heat-generating element (body) mounted on the jacket is reliably transmitted to every fin plate 2 with high efficiency, thereby improving the cooling performance of the heat exchanger.

Working Example 2

Next, a heat sink 102 according to working example 2 of the present teachings will be described, in which claw parts 25 (refer to FIG. 7) are formed by crimping a fin plate 202 to fix (squeeze) the linking part 3 in the latching groove 26. Although not shown in the drawings, the heat sink 102 of the present working example 2 also comprises a plurality of the fin plates 202, which are lined up spaced apart from one another (aligned in parallel) in the plate-thickness direction, and a linking part 3, which is disposed such that it intersects the plurality of fin plates 202 and holds the plurality of fin plates 202. Furthermore, the linking part 3 of working example 2 has the same configuration as in the working example 1.

Although not shown in the drawings, the fin plate 202 has a substantially oblong (e.g., rectangular) shape in a side view. In addition, a latching groove 26 is located in the fin plate 202 on one side in the plate-thickness direction at the one end part 23 in the longitudinal direction of the fin plate 202, similar to the fin plate 2 of working example 1.

Figure 8:
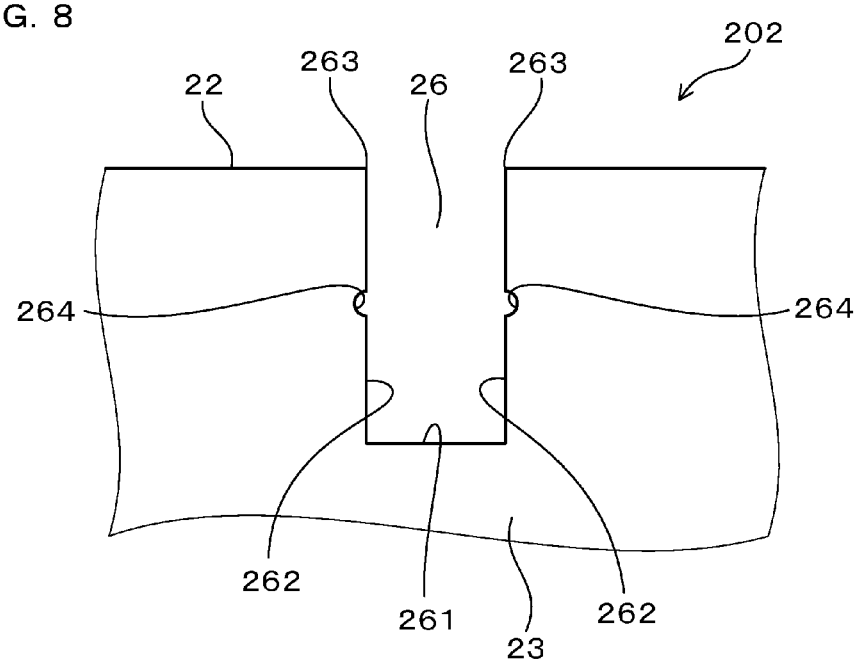
FIG. 8 is a partial-enlarged view of the vicinity of the latching groove, prior to the claw parts being formed, in the fin plate of working example 2.

As shown in FIG. 8, the latching groove 26 has a bottom surface 261, which is substantially parallel to the end surfaces 22 of the fin plate 202 in the plate-width direction, and a pair of groove side surfaces 262, each groove side surface 262 being perpendicular to the bottom surface 261. The depth of the latching groove 26 is substantially the same as the height of the base 31 that will be inserted into the latching groove 26. Although not shown in the drawings, when the base 31 has been inserted into the latching groove 26, there is a slight clearance between the base 31 and the fin plate 202 in the X-direction.

In addition, the groove side surfaces 262, which form (define) the space between an opening end 263 and the bottom surface 261 of the latching groove 26 in the fin plate 202, include notched parts 264, which are recessed more than the surrounding groove side surface 262. The notched parts 264 of the present working example 2 are formed at substantially the center parts of the groove side surfaces 262 in the plate-width direction (Z-direction). In addition, the notched parts 264 of the present working example 2 are formed as grooves that each have a semicircular cross section and extend in the plate-thickness direction (X-direction).

Figure 7:
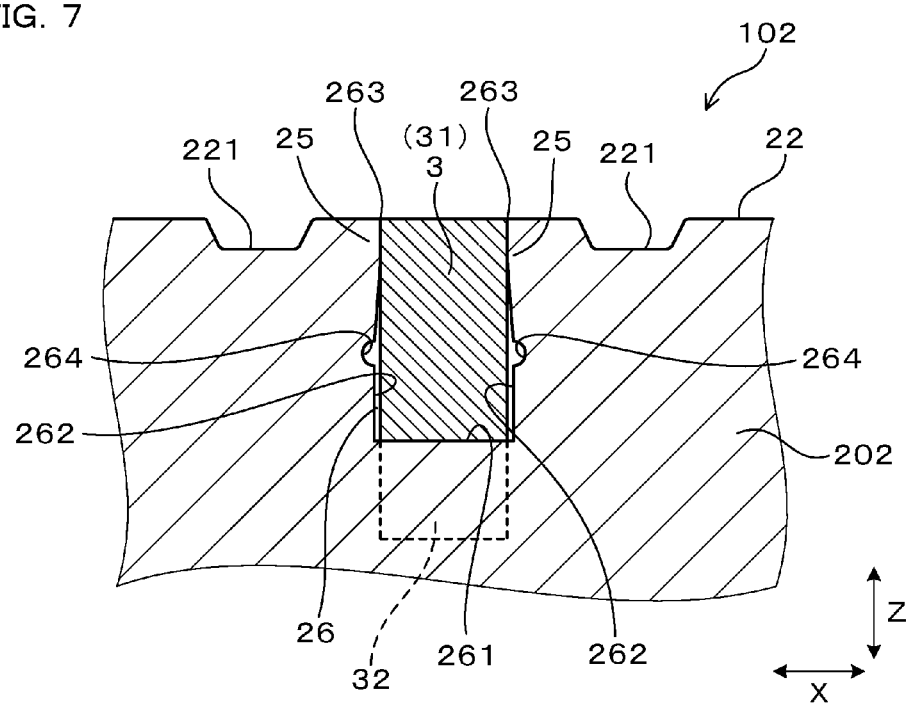
FIG. 7 is a partial cross-sectional view (a view corresponding to FIG. 3) of the vicinity of the latching groove, in which claw parts are formed, according to another embodiment (working example 2) of the present teachings.

The claw parts 25 are formed in each fin plate 202 as follows. The base 31 of the linking part 3 is inserted into the latching groove 26 and then the end surface 22 of the fin plate 202 is pressed in the plate-width direction inwardly (downwardly) on both sides of the opening ends 263, thereby causing the surrounding metal to plastically deform and causing both of the opening ends 263 to cave (move) in towards the linking part 3. When the portions of the end surface 22 adjacent to each opening end 263 are pressed in to crimp the linking part 3, pushed-in parts (depressions) 221 are formed as shown in FIG. 7, and the groove side surfaces 262 are caused to protrude (incline) more toward the base 31 on the side of the opening end 263 than the side of the notched part 264. As a result, the fin plate 202 is pressed (crimped) against the base 31, thereby squeezing the linking part 3. The claw parts 25 can thus be formed on (in) the fin plate 202 by the above-method to thereby fix the linking part 3.

Other aspects of working example 2 are the same as in working example 1. Furthermore, when the same reference numbers are used in FIG. 7 and FIG. 8, the structural elements, etc. are identical to those used in working example 1, except as otherwise explained.

In the fin plate 202 of the present working example 2, the groove side surfaces 262, which form (define) the space between the opening end 263 and the bottom surface 261 of the latching groove 26, include the notched parts 264, which are recessed more than their surrounding, and claw parts 25, which press against the linking part 3, more on the side of the opening end 263 of the latching groove 26 than on the side of the latching groove 26 between the notched part 264 and the bottom wall 261. Consequently, the fin plates 202 are fixed to the linking part 3 by the claw parts 25, and thereby the dimensional accuracy of the heat sink 102 after assembly can be made even higher. Furthermore, the linking part 3, the fin plates 202, and the like can be prevented from separating from the heat sink 102 after the heat sink 102 has been assembled, and consequently the heat sink 102 can be made easier to handle during the subsequent manufacturing processes. In other respects, the heat sink 102 of the present working example 2 is capable of achieving the same functions and effects as in working example 1.

Working Example 3

Figure 9:
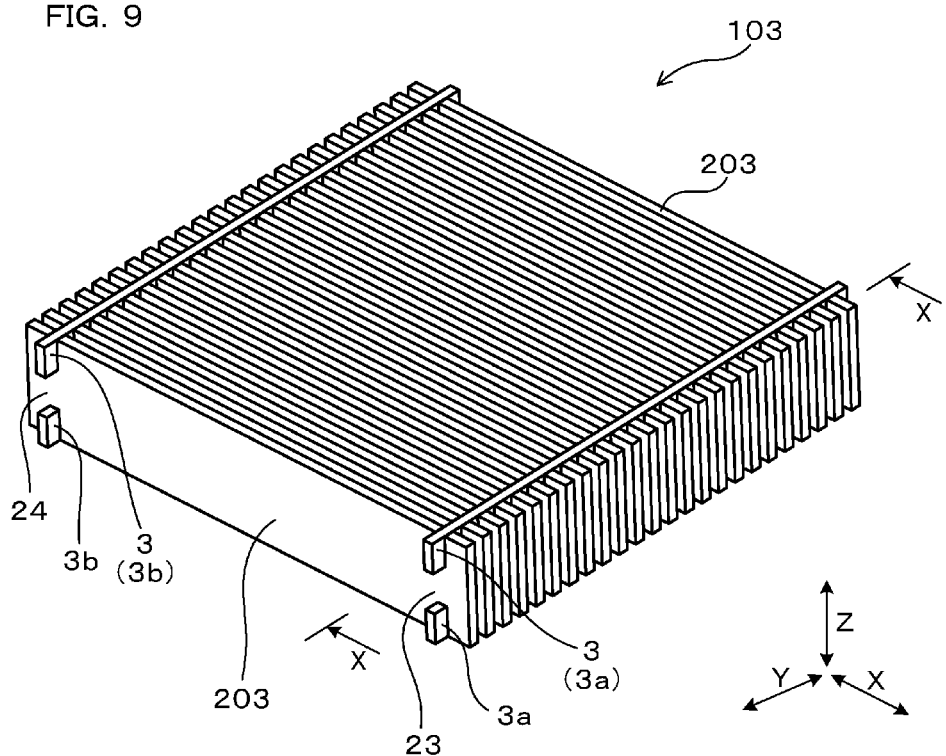
FIG. 9 is an oblique view of a heat sink, according to another embodiment (working example 3) of the present teachings, in which a plurality of the fin plates is held by four of the linking parts.

Next, a heat sink 103, as shown in FIG. 9, according to working example 3 of the present teachings will be described, in which a plurality of fin plates 203 is held by four of the linking parts 3 (3a, 3b). The heat sink 103 comprises a plurality of the fin plates 203 shown in FIG. 11 and four of the linking parts 3, which hold the plurality of fin plates 203.

Figure 10:
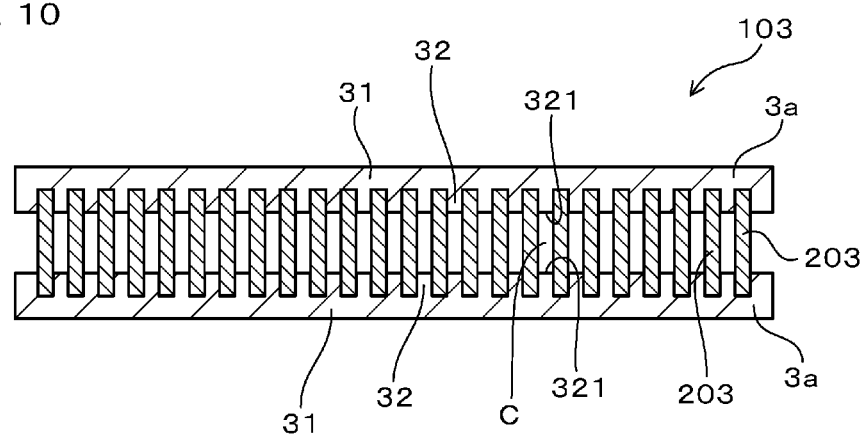
FIG. 10 is a cross-sectional view taken along line X-X in FIG. 9.
Figure 11:
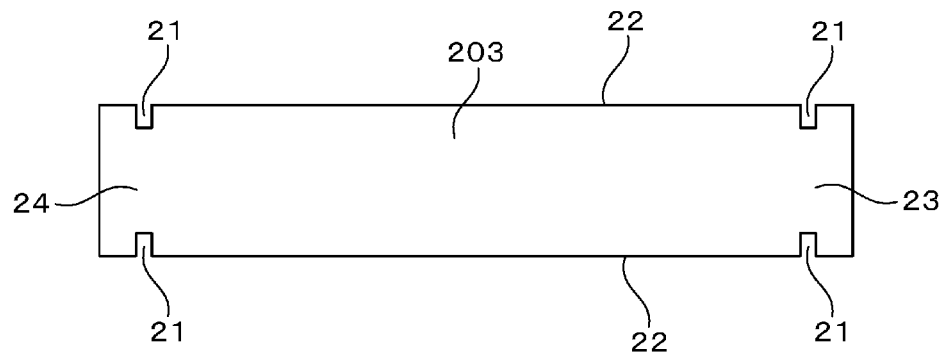
FIG. 11 is a side view of the fin plate, having four of the latching grooves, according to working example 3.

As shown in FIG. 11, each fin plate 203 has a substantially oblong (e.g., rectangular) shape in a side view. The latching grooves 21 of the fin plate 203 are formed on both sides in the plate-width direction (Z-direction) at both end parts 23, 24 of the fin plate 203 in the longitudinal direction (X-direction). In addition, as shown in FIG. 9 and FIG. 10, the linking parts 3 hold the plurality of fin plates 203 from (on) both sides in the plate-width direction at both end parts 23, 24 of the fin plate 203 in the longitudinal direction.

As shown in FIG. 9 and FIG. 10, two of the linking parts 3a are attached to the one end part 23 of each fin plate 203 in the longitudinal direction. As shown in FIG. 10, these two linking parts 3a are disposed such that the tip surfaces 321 of the positioning protrusions 32 oppose one another. In addition, although not shown in the drawings, the remaining two linking parts 3b, which are attached to the other end part 24 in the longitudinal direction of each fin plate 203, are disposed similar to the linking parts 3a attached to the end part 23, such that they oppose the tip surfaces 321 of the positioning protrusions 32.

The linking parts 3a, 3b have the same configuration as in working example 1. Therefore, as shown in FIG. 10, gaps C are formed between the tip surfaces 321 that oppose one another. In the heat sink 103, the coolant can be caused to flow into the spaces between adjacent fin plates 203 via these gaps C, and the coolant can be discharged from the spaces between the adjacent fin plates 203. Other aspects of working example 3 are the same as in working example 1. Furthermore, when the same reference numbers are used in FIGS. 9-11, the structural elements, etc. are identical to those used in working example 1, except as otherwise explained.

In the heat sink 103 of the present working example 3, the latching grooves 21 are formed on both sides in the plate-width direction at both end parts 23, 24 of the fin plates 203 in the longitudinal direction. In addition, the linking parts 3 hold the plurality of fin plates 203, from (on) both sides in the plate-width direction, at both end parts 23, 24 of the fin plates 203 in the longitudinal direction. Consequently, the positions of the fin plates 203 can be reliably stabilized by the four linking parts 3. As a result, an even higher dimensional accuracy of the heat sink 103 after assembly and after being attached to the heat exchanger can be achieved. In other respects, the heat sink 103 of the present working example 3 can achieve the same functions and effects as in working example 1.

Working Example 4

Figure 12:
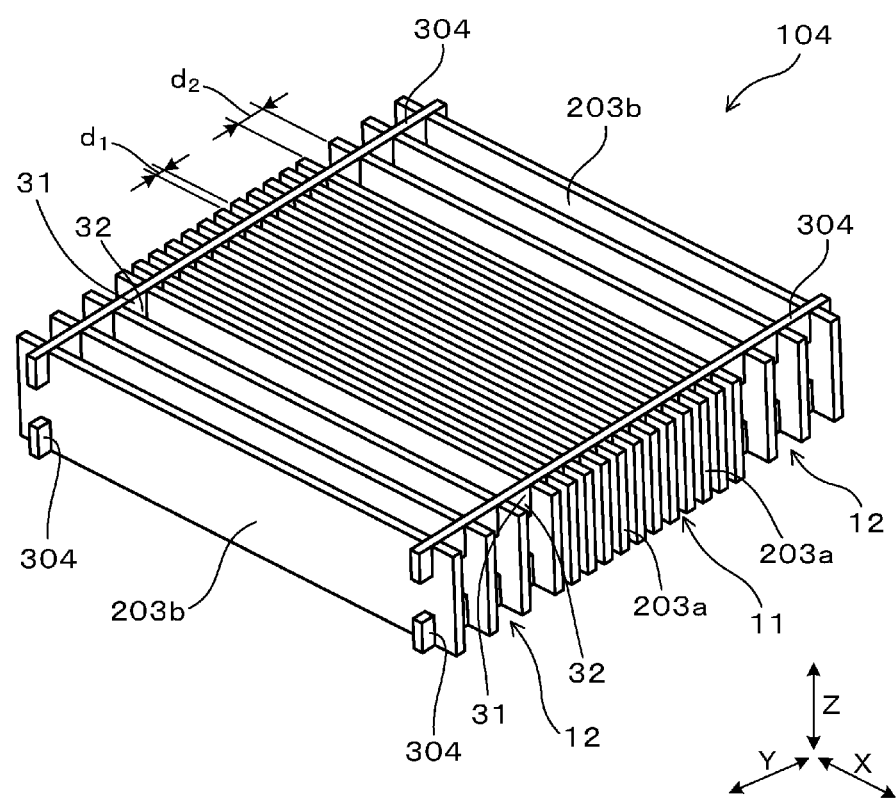
FIG. 12 is an oblique view of a heat sink, comprising a narrow-pitch section and a wide-pitch section, according to another embodiment (working example 4) of the present teachings.

Next, a heat sink 104 according to working example 4 of the present teachings will be described, in which the spacings between adjacent fin plates 203 is not constant or uniform in the Y-direction. As shown in FIG. 12, the heat sink 104 of the present working example 4 has a narrow-pitch section 11, in which the spacing between adjacent fin plates 203a is $d_1$, and two wide-pitch sections 12, in which the spacing between adjacent fin plates 203b is $d_2$, which is wider than $d_1$.

The narrow-pitch section 11 comprises fin plates 203a of the plurality of fin plates 203 (203a, 203b), which are disposed at (in) a central part of the heat sink 104 in the transverse direction Y. The fin plates 203a that constitute the narrow-pitch section 11 are disposed such that the spacing between adjacent fin plates 203a is $d_1$. In addition, the wide-pitch sections 12 each comprise the fin plates 203b, which are disposed outward of the narrow-pitch section 11 in the transverse directions Y. The fin plates 203b that constitute the wide-pitch sections 12 are disposed such that the spacing between adjacent fin plates 203b is $d_2$.

Although not shown in the drawings, linking parts 304 of the present working example 4 are configured such that, in the narrow-pitch section 11 and in each of the wide-pitch sections 12, the respective spacing between the fin plates 203 can be maintained. That is, the linking parts 304 of the present example are configured such that, when the bases 31 are inserted into the latching grooves 21, there are slight clearances between the fin plates 203a, which constitute the narrow-pitch section 11, and the positioning protrusions 32, which are disposed therebetween. In addition, the linking parts 304 are configured such that, when the bases 31 are inserted into the latching grooves 21, there are slight clearances between the fin plates 203b, which constitute the wide-pitch sections 12, and the positioning protrusions 32, which are disposed therebetween.

Other aspects are the same as in working example 3. Furthermore, when the same reference numbers are used in FIG. 12, the structural elements, etc. are identical to those used in working example 3, except as otherwise explained.

In the present working example 4, the balance in the flow rates of the coolant flowing between the fin plates 203 can be adjusted by appropriately modifying the spacing between adjacent fin plates 203. As a result, the cooling performance of the heat exchanger can be improved. In other respect, the heat sink 104 of the present working example 4 can achieve the same functions and effects as in working example 3.

Furthermore, in the present working example 4, the central part of the heat sink 104 in the transverse direction Y serves as the narrow-pitch section 11, and the wide-pitch sections 12 are configured (disposed) on both sides thereof in the Y-direction. However, the spacing between the fin plates 203 can be appropriately modified in accordance with the design of the heat exchanger. For example, the central part in the transverse direction Y may be designed to serve as the wide-pitch section 12, and the narrow-pitch sections 11 may be configured (disposed) on both sides thereof. In addition, a configuration can also be adopted such that, for example, the spacing between the fin plates 203 gradually narrows or gradually widens toward the center in the transverse direction Y. Furthermore, it is also possible to make it such that one half in the transverse direction Y serves as the narrow-pitch section 11 and the remaining (other) half constitutes the wide-pitch section 12.

Working Example 5

Figure 13:
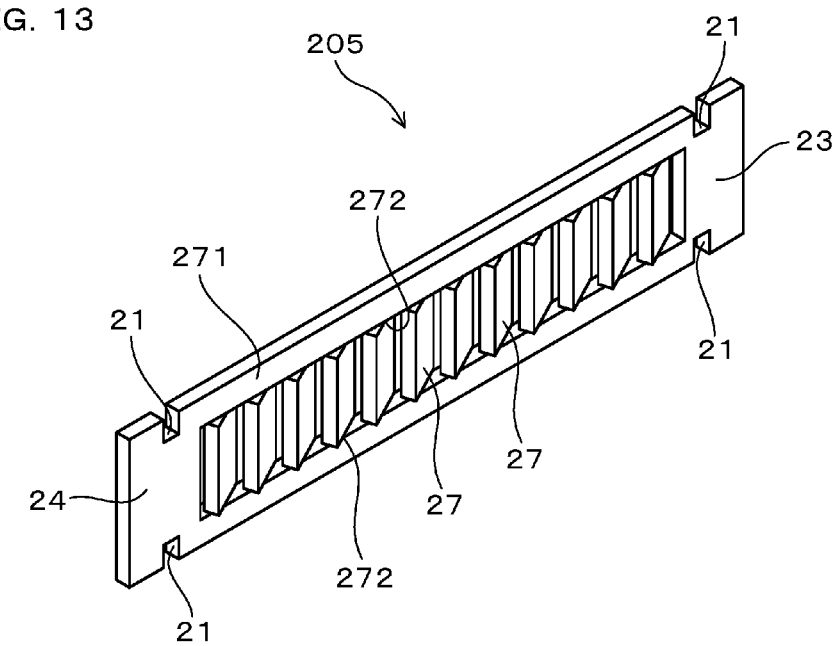
FIG. 13 is an oblique view of the fin plate, comprising cut-and-raised parts, according to another embodiment (working example 5) of the present teachings.

A fin plate 205 according to working example 5 of the present teachings includes cut-and-raised parts 27. As shown in FIG. 13, the fin plate 205 of the present working example 5 has a substantially oblong (e.g., rectangular) shape in a side view. In addition, the fin plate 205 comprises a plurality of the cut-and-raised parts 27, which is disposed at (in) a central part in a side view, and a perimetric-edge part (periphery) 271, which surrounds the outer perimeter of the cut-and-raised parts 27. The latching grooves 21 of the fin plate 205 are formed on both sides in the plate-width direction at both end parts 23, 24 in the longitudinal direction.

Each cut-and-raised part 27 has a bent part 272, which connects to the perimetric-edge part 271, on both sides of the fin plate 205 in the plate-width direction. In addition, each cut-and-raised part 27 has an oblong shape that is tilted in a diagonal direction with respect to the longitudinal direction of the fin plate 205. Each cut-and-raised part 27 can be formed by, for example, forming a slit, which separates the cut-and-raised part 27 from the perimetric-edge part 271, in the aluminum plate, and then bending the cut metal to tilt the cut-and-raised part 27. Furthermore, the formation of the slit and the bending described above can be performed by press working or the like.

Although not shown in the drawings, the heat sink can be configured by lining up the fin plates 205 of the present example spaced apart from one another in the plate-thickness direction, and then attaching the linking parts 3 to the latching grooves 21. Other aspects are the same as in working example 3. Furthermore, when the same reference numbers are used in FIG. 13, the structural elements, etc. are identical to those used in working example 3, except as otherwise explained. The heat sink of the present working example 5 can achieve the same functions and effects as in working example 3.

Working Example 6

Working example 6 of the present teachings is a heat exchanger 4 that comprises the heat sink 103 of working example 3, although any of the heat sinks disclosed herein may be utilized to manufacture heat exchangers according to the present teachings. As shown in FIG. 14 to FIG. 17, the heat exchanger 4 comprises the heat sink 103 and a jacket 41, which houses the heat sink 103. A heat-generating-element mounting surface 411, on which a heat-generating element is to be mounted, is provided (defined) on an outer surface of the jacket 41. In addition, the jacket 41 has a coolant-inflow port 412, into which coolant flows, a coolant-outflow port 413, from which the coolant is discharged, and a coolant passageway 414, which fluidly connects the coolant-inflow port 412 and the coolant-outflow port 413. The heat sink 103 is disposed in the coolant passageway 414.

Figure 14:
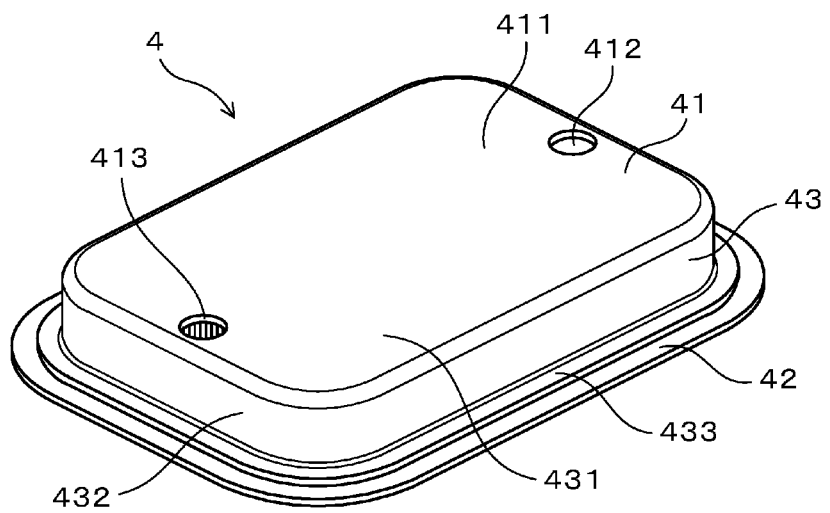
FIG. 14 is an oblique view of a heat exchanger, comprising the heat sink, according to another embodiment (working example 6) of the present teachings.
Figure 17:
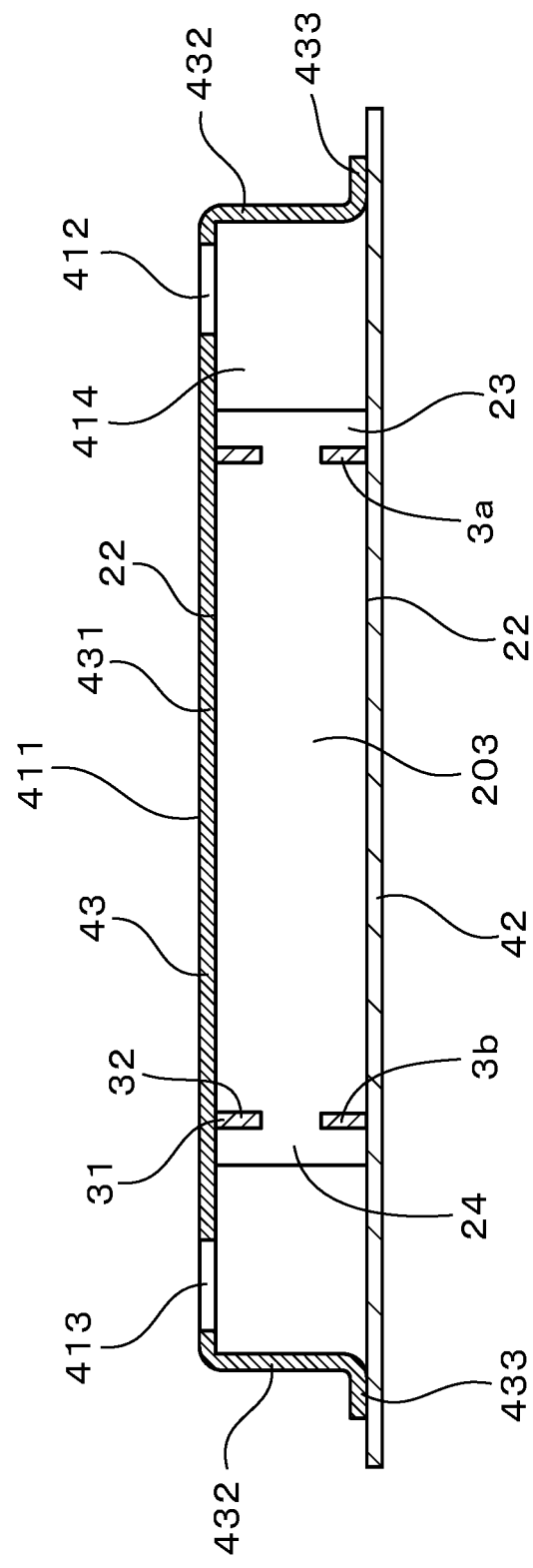
FIG. 17 is a cross-sectional view taken along line XVII-XVII in FIG. 15.

As shown in FIG. 14, the jacket 41 comprises a bottom wall 42, which has a substantially oblong (e.g., rectangular) shape, and a cup part 43, which is mounted on the bottom wall 42. The cup part 43 comprises: a top wall 431, which is disposed opposing the bottom wall 42 and has a substantially oblong (e.g., rectangular) shape; a side wall 432, which extends from an outer-perimetric-end edge of the top wall 431 toward the side of the bottom wall 42; and a flange 433, which is formed on a tip of the side wall 432 and is joined to the bottom wall 42. As shown in FIG. 17, the coolant passageway 414 of the jacket 41 is defined by the internal space that is enclosed by the bottom wall 42, the side wall 432, and the top wall 431. Furthermore, the bottom wall 42 can be joined to the flange 433 by a variety of known methods such as, e.g., brazing, welding, friction stir welding, or the like.

Figure 15:
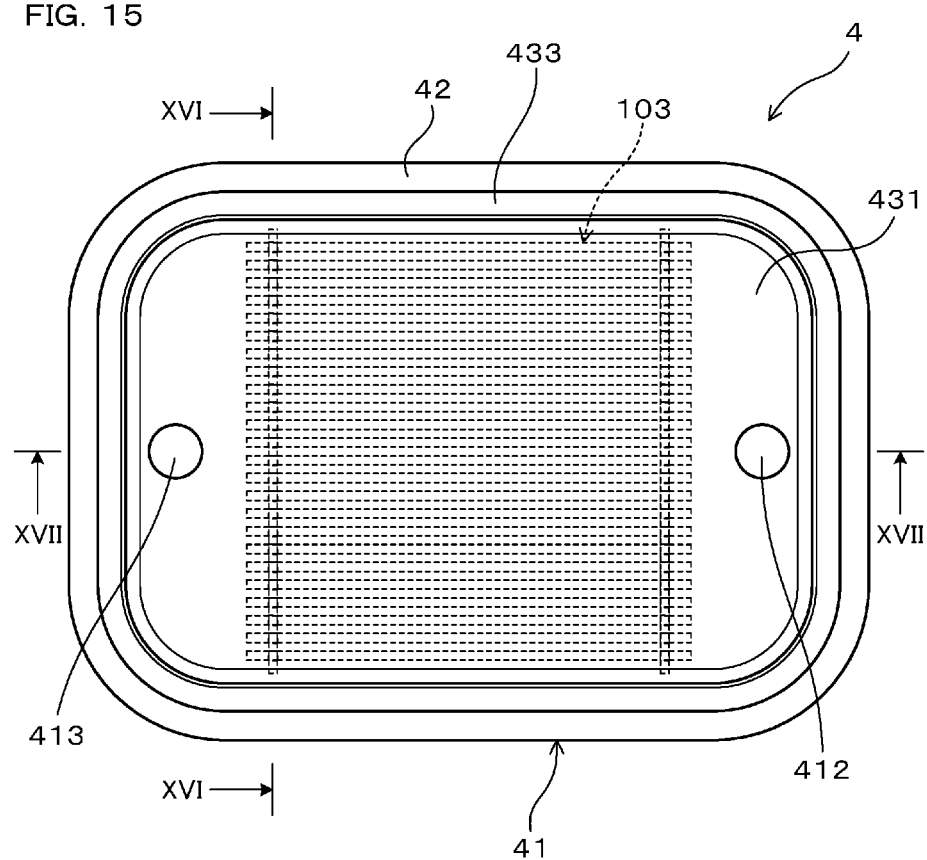
FIG. 15 is a plan view of the heat exchanger according to working example 6.

As shown in FIG. 14, the heat-generating-element mounting surface 411 is disposed on the outer surface of the top wall 431 of the cup part 43. In addition, as shown in FIG. 14 and FIG. 15, the coolant-inflow port 412 and the coolant-outflow port 413 are formed at the central part of the two short sides of the outer-perimetric-edge part of the top wall 431.

As was noted above, the heat sink 103 of the present working example 6 has the same configuration as in working example 3. As shown in FIG. 15 and FIG. 17, the heat sink 103 is disposed, in the coolant passageway 414, between the coolant-inflow port 412 and the coolant-outflow port 413. In addition, the heat sink 103 is disposed such that the end parts 23 of the fin plate 203 in the longitudinal direction face the side of the coolant-inflow port 412, and the other end parts 24 face the side of the coolant-outflow port 413.

Figure 16:
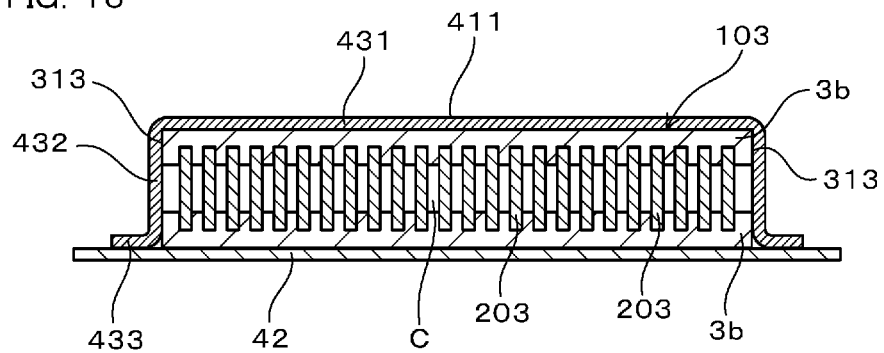
FIG. 16 is a cross-sectional view taken along line XVI-XVI in FIG. 15.

As shown in FIG. 17, the end surface 22 of each fin plate 203 in the plate-width direction is joined to the inner surface of the top wall 431 or to the inner surface of the bottom wall 42. In the present working example 6, both end surfaces 22 of each fin plate 203 in the plate-width direction are respectively joined to the upper and lower inner surfaces of the jacket 41 via brazed parts (fillets) (not shown). In addition, as shown in FIG. 16, both end surfaces 313 of the linking parts 3 of the base parts 31 in the longitudinal direction (the transverse direction Y) respectively make contact with the inner surface of the side wall 432.

Because the heat exchanger of the present working example 6 has the above-mentioned configuration, the coolant that flows in from the coolant-inflow port 412 can be forced to circulate between adjacent fin plates 203 and then discharged from the coolant-outflow port 413, thereby cooling the heat-generating element mounted on the top wall 431.

In addition, both end surfaces 22 of the fin plates 203 in the plate-width direction are joined by brazing to the respective opposite inner surfaces of the jacket 41. Consequently, heat from the heat-generating element mounted on the heat-generating-element mounting surface 411 can be transmitted to every fin plate 203 with good efficiency, thereby further improving the cooling performance of the heat exchanger 4.

Figure 18:
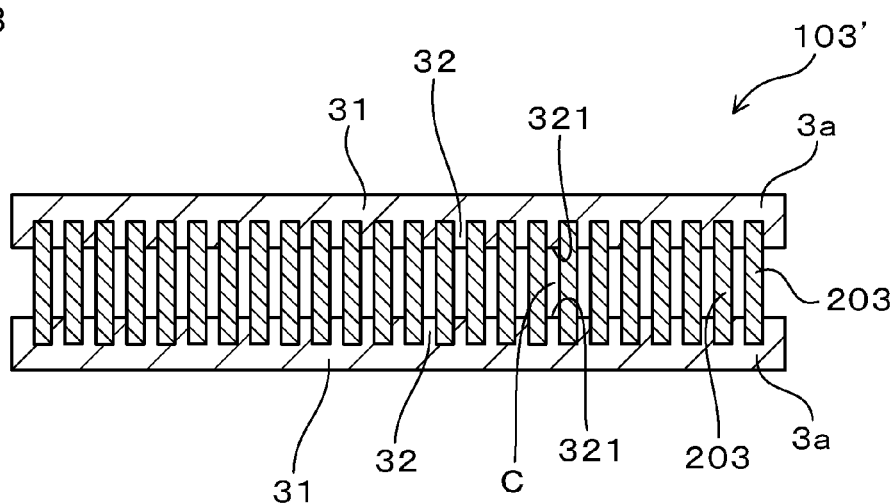
FIG. 18 is an oblique view of a heat sink, according to another embodiment of the present teachings, in which the spacing between adjacent fin plates is narrower than the plate thickness of the fin plates.

Heat sinks and heat exchangers according to the present invention are not limited to the configurations of working example 1 to working example 6 described above, and these configurations can be modified as appropriate within a scope that does not depart from the gist of the present invention. For example, working example 1 to working example 5 describe examples in which the fin plates all have the same configuration. However, other configurations may be adopted in which some of the fin plates of the plurality of fin plates have a plate thickness that is thicker than the other fin plates or may differ from the other fin plates in, for example, having unevenness or the like on its surfaces. For example, FIG. 18 shows a modification (heat sink 103') of the embodiment of FIGS. 9-11 (such that the same reference numbers will be used for the various structural elements), in which the spacing or gap C between adjacent fin plates 203 is narrower than the plate thickness of the fin plates 203 because the width of the positioning protrusions 32 is narrower than the plate thickness of the fin plates 203. As a non-limiting example, the plate thickness of the fin plates 203 may be, e.g., 1 mm and the width of the positioning protrusions may be, e.g., 0.8 mm, although these thickness and widths may be appropriately selected based upon the particular application of the present teachings.

In addition, working example 1 and working examples 3-5 describe examples in which, after the heat sink 1, 103, 104 and the like are assembled, the fin plates 2, 203, 203a, 203b, 205 are not crimped to the linking part(s) 3, 3a, 3b, 304. However, after the linking part(s) 3, 3a, 3b, 304 has (have) been attached to the fin plates 2, 203, 203a, 203b, 205, the fin plates 2, 203, 203a, 203b, 205 may be crimped in the same manner as in working example 2. In this case, in addition to the functions and effects of these working examples, it is also possible to achieve the functions and effects produced by the claw parts.

In addition, working example 6 describes an example of a heat exchanger in which both end surfaces 22 of the fin plates 203 in the plate-width direction are joined by brazing to an inner surface of the jacket 41. However, for example, just the end surfaces 22 that make contact with the top wall 431 may be brazed. In this case, the end surfaces 22 on the side of the bottom wall 42 of the fin plates 203 may be separated (spaced apart) from the inner surface of the bottom wall 42.

Representative, non-limiting examples of the present invention were described above in detail with reference to the attached drawings. This detailed description is merely intended to teach a person of skill in the art further details for practicing preferred aspects of the present teachings and is not intended to limit the scope of the invention. Furthermore, each of the additional features and teachings disclosed above and below may be utilized separately or in conjunction with other features and teachings to provide improved heat sinks, improved heat exchangers and methods of manufacturing the same.

Moreover, combinations of features and steps disclosed in the above detailed description, as well as in the experimental examples, may not be necessary to practice the invention in the broadest sense, and are instead taught merely to particularly describe representative examples of the invention. Furthermore, various features of the above-described representative examples, as well as the various independent and dependent claims below, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

We claim:

1. A heat sink, comprising:
a plurality of fin plates, which are lined up spaced apart from one another in a plate-thickness (Y) direction; and
at least one linking part disposed such that it intersects and holds the plurality of fin plates;
wherein the at least one linking part comprises a base, which has a rod or bar shape, and a plurality of positioning protrusions, which protrude from a side surface of the base; and
each of the fin plates has at least one latching groove, into which the base is inserted such that each fin plate is located between adjacent positioning protrusions of the at least one linking part;
wherein the fin plates have:
notched parts, which are recessed more than their surroundings, on groove side surfaces that define spaces between open ends and a bottom surface of the at least one latching groove, and
claw parts that press against the linking part more on the side of the open ends of the latching groove than on the side of the notched parts.

2. The heat sink according to claim 1, wherein:
the at least one latching groove comprises a plurality of latching grooves that are respectively formed on both sides in a plate-width (Z) direction at both end parts of each fin plate in the longitudinal direction; and
the at least one linking part comprises a plurality of linking parts that respectively hold the plurality of fin plates from or on both sides in the plate-width direction at both end parts of each fin plate in the longitudinal direction.

3. The heat sink according to claim 2, wherein the plurality of linking parts is respectively disposed in the plurality of latching grooves respectively located at a first end surface and at a second end surface of the fin plates, the first and second end surfaces of the fin plates being opposite of each other in the plate-width (Z) direction.

4. The heat sink according to claim 3, wherein each of the first end surface and the second end surface of the heat sink has a degree of planarity in the plate-width (Z) direction of the fin plates of 0.2 mm or less.

5. The heat sink according to claim 4, wherein the heat sink has a narrow-pitch section, in which the spacing between adjacent fin plates is $d_1$, and a wide-pitch section, in which the spacing between adjacent fin plates is $d_2$, which is wider than $d_1$.

6. The heat sink according to claim 4, wherein the heat sink has a portion in which the spacing between adjacent fin plates is narrower than the plate thickness of the fin plates.

7. The heat sink according to claim 4, wherein:
each of the plurality of latching grooves has a respective bottom surface, two groove side surfaces respectively extending from the bottom surface and two open ends defined at the end of the groove side surfaces that is opposite of the bottom surface, the notched parts being formed in an intermediate portion of each of the two groove side surfaces between the bottom surface and the respective open end, and
each of the fin plates has two claw parts that respectively press against the linking part more in a portion of the side surface between the notched part and the open end than in a portion between the notched part and the bottom surface.

8. The heat sink according to claim 7, wherein depressions are defined in each of the fin plates, each of the depressions having a depth of 0.1-0.5 millimeters and having a center that is spaced 0.2-1.0 millimeters from a closest adjacent one of the linking parts.

9. The heat sink according to claim 1, wherein the at least one linking part is attached such that its base is flush with an end surface of the fin plates in the plate-width (Z) direction.

10. The heat sink according to claim 1, wherein the heat sink has a narrow-pitch section, in which the spacing between adjacent fin plates is $d_1$, and a wide-pitch section, in which the spacing between adjacent fin plates is $d_2$, which is wider than $d_1$.

11. The heat sink according to claim 1, wherein the heat sink has a portion in which the spacing between adjacent fin plates is narrower than the plate thickness of the fin plates.

12. The heat sink according to claim 1, wherein an end surface of the heat sink has a degree of planarity in the plate-width (Z) direction of the fin plates of 0.2 mm or less.

13. The heat sink according to claim 1, wherein each of the fin plates has a plate thickness of 0.3-1.5 millimeters.

14. The heat sink according to claim 1, wherein each of the fin plates has a cut-and-raised part configured to disrupt a flow of coolant across the fin plate.

15. The heat sink according to claim 1, wherein depressions are defined in each of the fin plates, each of the depressions having a depth of 0.1-0.5 millimeters and having a center that is spaced 0.2-1.0 millimeters from a closest adjacent one of the linking parts.

16. A heat exchanger, comprising:
a heat sink having a plurality of fin plates, which are lined up spaced apart from one another in a plate-thickness (Y) direction; and
the heat sink having at least one linking part disposed such that it intersects and holds the plurality of fin plates;
wherein the at least one linking part comprises a base, which has a rod or bar shape, and a plurality of positioning protrusions, which protrude from a side surface of the base;
wherein each of the fin plates has at least one latching groove, into which the base is inserted such that each fin plate is located between adjacent positioning protrusions of the at least one linking part;
wherein the fin plates have notched parts, which are recessed more than their surroundings, on groove side surfaces that define spaces between open ends and a bottom surface of the at least one latching groove, and claw parts that press against the linking part more on the side of the open ends of the latching groove than on the side of the notched parts; and
a jacket that houses the heat sink,
wherein a surface configured to mount a heat-generating element is defined on an outer surface of the jacket;
the jacket has a coolant-inflow port for receiving a coolant, a coolant-outflow port for discharging the coolant, and a coolant passageway fluidly connecting the coolant-inflow port and the coolant-outflow port; and
the heat sink is disposed in the coolant passageway.

17. The heat exchanger according to claim 16, wherein opposite end surfaces of the fin plates in the plate-width (Z) direction are joined by brazing to respective opposite inner surfaces of the jacket.

18. An apparatus, comprising:
a plurality of fin plates disposed in parallel in a first direction, each of the fin plates having a latching groove; and
at least one link extending at least substantially in the first direction,
wherein the at least one link is rod-shaped or bar-shaped;
the at least one link has a base that engages in the latching grooves of the fin plates and a plurality of protrusions that are respectively disposed between adjacent ones of the fin plates;
at least first and second notches are respectively defined in opposing walls of each of the latching grooves and extend in the first direction;
first and second claws are respectively defined on the opposing walls of each of the latching grooves between the first and second notches and an open end of each of the latching grooves; and
the first and second claws press against the at least one link more on the side of the open ends of the latching grooves than on the side of the first and second notches.

19. The apparatus according to claim 18, further comprising a jacket comprising:
an outer surface configured to mount a heat-generating element;
a coolant-inflow port for receiving a coolant,
a coolant-outflow port for discharging the coolant, and
a coolant passageway fluidly connecting the coolant-inflow port and the coolant-outflow port;
wherein the fin plates and at least one link are disposed within the coolant passageway.

20. The apparatus according to claim 19, wherein:
the at least one latching groove comprises a plurality of latching grooves that are respectively defined in end portions of each of the fin plates; and
the at least one linking part comprises a plurality of linking parts that respectively engage the plurality of fin plates and extend along the first direction.

* * * * *